United States Patent [19]
Kazama

[11] Patent Number: 6,150,616
[45] Date of Patent: Nov. 21, 2000

[54] ELECTROCONDUCTIVE CONTACT UNIT SYSTEM

[75] Inventor: Toshio Kazama, Nagano, Japan

[73] Assignee: NHK Spring Co., Ltd., Nagano, Japan

[21] Appl. No.: 09/171,067

[22] PCT Filed: Apr. 10, 1997

[86] PCT No.: PCT/JP97/01237

§ 371 Date: Oct. 9, 1998

§ 102(e) Date: Oct. 9, 1998

[87] PCT Pub. No.: WO97/39361

PCT Pub. Date: Oct. 23, 1997

[30] Foreign Application Priority Data

| Apr. 12, 1996 | [JP] | Japan | 8-115782 |
| Oct. 30, 1996 | [JP] | Japan | 8-304058 |
| Dec. 27, 1996 | [JP] | Japan | 8-350680 |

[51] Int. Cl.[7] .............. H01R 12/04; H05K 1/11
[52] U.S. Cl. ............ 174/267; 361/787; 324/754
[58] Field of Search ............... 174/267, 261, 174/260; 361/769, 787; 324/149, 537, 538, 754, 765

[56] References Cited

U.S. PATENT DOCUMENTS

| 3,648,220 | 3/1972 | Julinot | 339/17 R |
| 4,667,148 | 5/1987 | Albright et al. | 324/51 |
| 4,724,377 | 2/1988 | Maelzer et al. | 324/73 |
| 5,017,738 | 5/1991 | Tsuji et al. | 174/94 R |

FOREIGN PATENT DOCUMENTS

| 63-161366 | 10/1988 | Japan. |
| 63-257239 | 10/1988 | Japan. |
| 4-127581 | 11/1992 | Japan. |
| 6-74972 | 3/1994 | Japan. |

*Primary Examiner*—Jeffrey Gaffin
*Assistant Examiner*—Jeremy Norris
*Attorney, Agent, or Firm*—Skjerven Morrill MacPherson LLP; Alan H. MacPherson

[57] ABSTRACT

In an electroconductive contact unit, a base end of a compression coil spring which may be either a contact member itself or a spring member for urging a needle-shaped contact member is received in a support recess formed in a base board. An end of the internal conductor of the base board is exposed on the bottom end of the support recess, and is electrically connected to the base end of the compression coil spring. There is no need for any electric connector, and the electric resistance between the internal conductor of the base board and the contact member can be minimized. To ensure a favorable electric connection, a base end of the compression coil spring may be soldered to the exposed end of the internal conductor which may be either flat or recessed.

18 Claims, 13 Drawing Sheets

ELECTROCONDUCTIVE CONTACT UNIT SYSTEM

TECHNICAL FIELD

The present invention relates to an electroconductive contact unit which is suitable for use in contact probes and probe cards for testing printed circuit boards, semiconductor devices, and semiconductor wafers, as well as for use as electric sockets and connectors for semiconductor devices and other forms of electric equipment.

BACKGROUND ART

Various forms of contact units have been used in contact probes and probe cards for testing printed circuit boards, semiconductor devices, and semiconductor wafers, as well as in electric sockets and connectors for semiconductor devices and others. For instance, in testing a semiconductor wafer, a DC test is initially carried out, and after cutting the wafer into small chips, an AC test is carried out on each of the chips.

According to a conventional wafer test, as illustrated in FIG. 16, a test unit, which is normally called a probe card and comprises a planar support member 32 and needle-shaped electroconductive contact members 31 mounted on the support member 32, is applied to a wafer 2 which is desired to be tested as an object to be accessed. The contact members 31 are defined by forming electroconductive and resilient wire members into the shape of a rake. According to this arrangement, because the needle section of each of the contact members 31 is relatively long, only a relatively poor electric property can be achieved, and the contact unit is normally inadequate for handing signals faster than 50 MHz. Also, if the objects to be contacted are spherical in shape, the contact may become unstable because of the tendency of the contact members to slip over the surface of the parts to be contacted.

To meet the demand for an accessing capability for high speed signals, membrane type contact units have been developed, and a membrane probe as illustrated in FIG. 17 is known as such a membrane type electroconductive contact unit. In this membrane probe, a plurality of bumps 35 serving as contact members are formed on a film base 34 which is in turn mounted on a support member 33. However, because the bumps 35 are not resilient by themselves, a stable contact pressure (electric contact resistance) cannot be attained.

Therefore, as illustrated in FIG. 17, a high pressure air is applied to the side of the film base 34 facing away from the bumps 35 to establish a required state of contact between the bumps 35 and the wafer 2. However, the heights of the bumps 35 are not necessarily uniform, and the wafer surface may not be completely planar so that the system may be unable to accommodate such irregularities in the heights of the bumps, and the electric contact resistance may therefore become unstable.

According to a known electroconductive contact unit suitable for use in contact probe units for testing electroconductive patterns on printed circuit boards and semiconductor devices, an electroconductive needle member is received in each tubular holder so as to be axially moveable into and out of the tubular holder, and is resiliently urged out of the tubular holder until it is restricted from moving further out of the tubular member. According to such an electroconductive contact unit, the forward end of the electroconductive needle member is resiliently pushed against an object to be tested so that an electric signal may be transmitted between the object to be tested and an external circuit.

However, when an electric current flows through the compression coil spring, it produces an inductance which is proportional to the square of the number of turns. Therefore, when the electric signal flowing through the contact probe consists of a high frequency signal (in the order of tens of MHz to several GHz), the high frequency signal flows though the coiled electroconductive member, and the resulting increase in the inductance and electric resistance may adversely affect the electric properties of the detected signal.

SUMMARY

In view of such problems of the prior art, a primary object of the present invention is to provide an electroconductive contact unit which is simple in structure and is suitable for arranging the contact members in a highly dense arrangement.

A second object of the present invention is to provide an electroconductive contact unit which is simple in structure and economical to manufacture.

A third object of the present invention is to provide an electroconductive contact unit which has favorable electric properties.

These and other objects of the present invention can be accomplished by providing an electroconductive contact unit, comprising: a base board having a first surface and a second surface; an internal conductor having an end terminating at the second surface; a support recess formed on second surface exposing the end of the internal conductor to an interior of the recess; a contact member received in the support recess and having an inner end which is in electric contact with the exposed end of the internal conductor, and an outer end which axially moveably projects out of the support recess, and is adapted to contact an object to be accessed; and biasing means for resiliently supporting the contact member.

Therefore, a part of the contact member can be electrically connected to the internal conductor of the base board directly via the support recess in a guided manner without relying on any connector. As a result, any unreliable contact portions which may prevent reduction in electric resistance can be eliminated from the path of signal transmission, and the reduction in the electric resistance can be achieved without any difficulty. Also, the overall structure can be simplified, and the manufacturing cost can be reduced. In particular, the repair and maintenance work as well as the assembly process can be simplified. Also, using a relay board or by suitably adapting the base board, the contact unit can be readily adapted to different applications. Typically, the base board is incorporated with an internal circuit.

According to a preferred embodiment of the present invention, the contact member comprises an electroconductive coil member having a base end received in the support recess, the coil member providing the function of the biasing means with a resilient property of the material thereof. In this case, because the contact member can be directly connected to the internal conductor of the base board, the electric resistance in the signal transmission path can be minimized without any difficulty. For instance, the base end of the electroconductive coil member may comprise a closely wound portion so that it may be tightly fitted into a recess formed in the exposed end of the internal conductor or to be firmly pushed against the exposed end of the internal conductor. To ensure a favorable connection both electrically and mechanically, it is particularly preferable if the base end of the coil member is soldered to an electroconductive part of the recess which is electrically connected to the internal conductor.

To accurately control the projecting length of the contact member of each contact unit, the coil member may comprise a coarsely wound portion which is retained inside the support recess in a pre-compressed state. Normally, the contact unit system comprises a large number of contact members arranged extremely close to each other so that a large number of points of the object may be tested at the same time. If the coarsely wound portion of the coil member includes a large pitch portion and a small pitch portion, the adjacent coil wire segments of the small pitch portion of the coil member may be made to touch each other as soon as the coil member is deflected to a certain extent so that the electric signal is allowed to flow axially along a straight path, instead of flowing along a spiral path along the coil wire, and the inductance of the contact member can be thereby minimized. The outer end of the coil member may also consist of a closely wound portion for similarly reducing the inductance of the signal transmission path.

According to another preferred embodiment of the present invention, the contact member comprises a needle-shaped member slidably received in the support recess, and the biasing means comprises a compression coil spring interposed between a bottom end of the support recess and an annular shoulder defined in the contact member. This embodiment can provide a relatively large stroke for the contact member in a stable manner, and is suitable for accessing relatively large components such as printed circuit boards and semiconductor devices.

The compression coil spring may comprise a base end consisting of a closely wound portion thereof which is adapted to establish an electric connection with a base end of the contact member at least when the compression coil spring is compressed as a result of a contact between a forward end of the contact member and an object to be tested. This electric signal is thus allowed to flow from the contact member to the internal conductor via the closely wound portion of the coil member, and is allowed to flow a straight path instead of a spiral path so that the electric resistance and inductance of the signal transmission path can be minimized. This is particularly enhanced when adjacent coil sections of the closely wound portion of the coil spring are joined by solder or brazing material.

To ensure a favorable electric connection between the coil member and the contact member and to allow them to be handled as an integral unit before and during the assembly work, the contact member may comprise a collar portion adjacent to the shoulder which is adapted to resiliently fit into a forward end of the compression coil spring.

The support recess may be formed by a recess formed in the exposed end of the internal conductor. The assembly may further comprise an insulating plate which is placed over the second surface of the base board, and, in this case, the support recess may be defined jointly by the exposed end of the internal conductor, and an inner circumferential surface of a through hole passed through the insulating plate in axial alignment with the exposed end of the internal conductor.

The through hole of the insulating plate may be provided with a small diameter portion at an end remote from the base board, the small diameter portion providing retaining means for restricting a projecting length of the contact member out of the support recess. Alternatively, the assembly may further comprise a retaining plate placed over a surface of the insulating plate remote from the base board, the retaining plate being provided with a through hole which is aligned with the through hole of the insulating plate and has a smaller diameter than the through hole of the insulating plate so as to provide retaining means for restricting a projecting length of the contact member out of the support recess. By so doing, it is possible to control the projecting length of each contact member so that a precise and stable contact may be established when a large number of contact members are arranged one next to the other, and a large number of points are to be simultaneously accessed by them. This is an important consideration particularly when the points to be tested are not arranged precisely on a single plane but have somewhat irregular heights.

BRIEF DESCRIPTION OF DRAWINGS

Now the present invention is described in the following with reference to the appended drawings, in which.

BEST MODE FOR CARRYING OUT THE INVENTION

Figure 1:
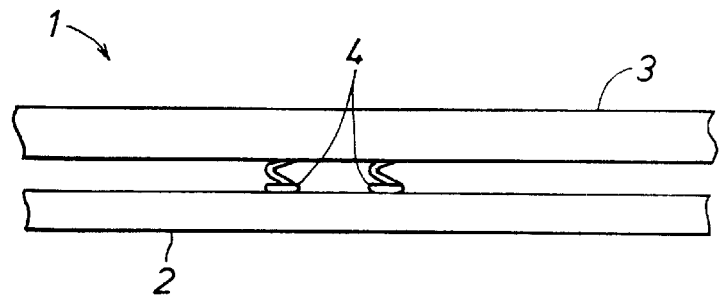
FIG. 1 is a fragmentary sectional view showing a first embodiment of the present invention constructed as an electroconductive contact unit system for testing wafers.

FIG. 1 is a fragmentary side view of a probe card 1 for testing wafers to which the present invention is applied. Referring to FIG. 1, a load board 3 serving as a base board is placed opposite to a semiconductor wafer 2 which is given as an exemplary object to be tested, and a prescribed number of electroconductive contact members 4 are provided on an outer surface (which opposes the wafer 2) of the load board 3. When testing the wafer 2, the load board 3 is moved toward the wafer 2 by an appropriate distance by a drive unit not shown in the drawing until the contact members 4 come into contact with the wafer 2.

Figure 2:
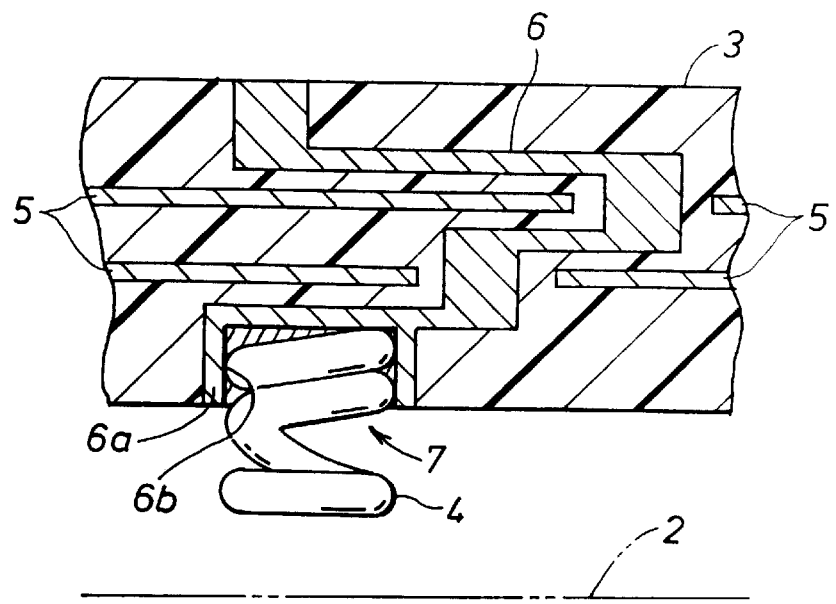
FIG. 2 is an enlarged sectional side view of an essential part of FIG. 1.

The structure of the probe card 1 is described in the following with reference to FIG. 2 which is an enlarged sectional view of an essential part of FIG. 1. This load board 3 comprises a multi-layer circuit board having a plurality of ground layers 5 laminated one over the other with certain gaps defined between them, and internal conductors 6 forming a part of an electric circuit are passed in the depthwise direction across the load board so as to circumvent the ground layers 5 as required.

Exposed parts 6a of the internal conductors 6 on the surface of the load board 3 facing the wafer 2 are provided with recesses 6b which are directly used as support recesses 7 opening out toward the wafer 2. In other words, the inner circumferential surface and the bottom surface of each of the support recesses 7 are formed by a part of the material of the internal conductor 6. An end of a contact member 4 consisting of an electroconductive coil spring member is received in each of the support recesses 7, and is secured therein by securing means such as solder or brazing material so that the internal conductor 6 and the contact member 4 are connected to each other both electrically and mechanically.

In the illustrated embodiment, the base end portion of the contact member 4 is formed by a closely wound portion of the coil spring, and this closely wound portion is received in the support recess 7 while the remaining, less closely wound portion extends out of the support recess 7. By thus forming each contact member 4 from a coil spring member, it is possible to more closely arrange the contact members 4 than is possible with a more conventional contact probe arrangement employing a tubular holder for retaining each straight, needle-shaped contact member. Thus, a number of contact members 4 can be arranged close to each other. By adjusting the number of turns of the less closely wound portion or the coarsely wound portion of each contact member 4, and limiting the extending length thereof to 1 mm or less, it is possible to minimize the electric resistance and inductance while ensuring a sufficient deflection stroke. This arrangement thus allows a test to be conducted with favorable electric properties.

Figure 3:
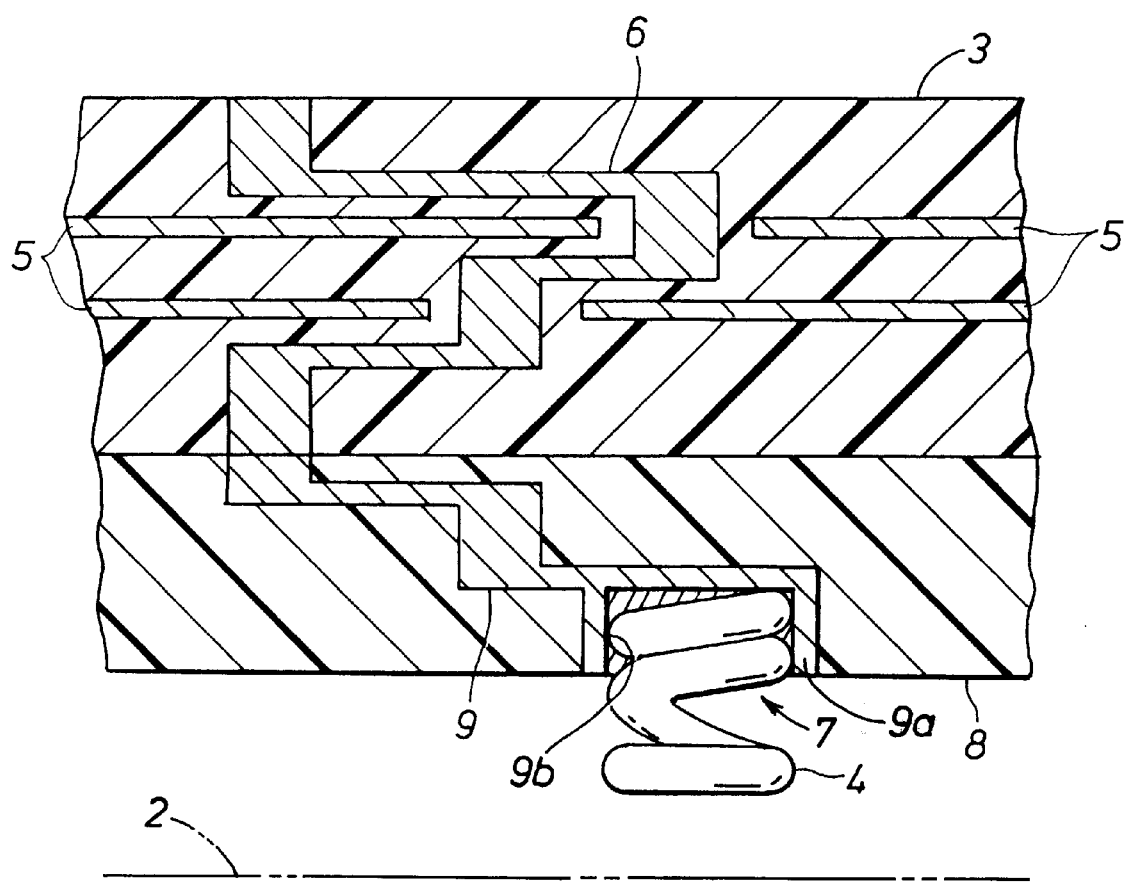
FIG. 3 is a view similar to FIG. 2 showing a second embodiment of the present invention using a relay board.

In the illustrated embodiment, the contact members 4 were arranged on a simple load board 3. It is also possible to apply the same principle to a load board 3 incorporated with a relay board 8 on the side of the load board 3 facing the wafer 2 as illustrated in FIG. 3. According to this second embodiment of the present invention, relay internal conductors 9 are passed depthwise across the relay board 8 similarly to the internal conductors 6 of the load board 3 are passed depthwise across the load board 3. Each relay internal conductor 9 is connected to a corresponding one of the internal connectors 6 of the load board 3 by a solder ball, a pin or the like. A recess 9b similar to the aforementioned recess 6b is formed on the exposed part 9a of each relay internal conductor 9 facing the wafer 2 to define a support recess 7 which opens toward the object to be tested.

Similarly to the first embodiment, the closely wound end portion of each contact member 4 is received in the associated support recess 7, and is secured therein by solder or the like. In this case, it is possible to minimize the pitch of the contact members 4 which are arranged on the side of the relay board 8 facing the wafer 2 even when there is some difficulty in arranging the exposed parts of the internal conductors 6 facing the wafer 2 as desired, and these exposed parts cannot be arranged as closely together as desired, because the relay internal conductors 9 can be freely arranged inside the relay board 8 so as to compensate for the lack of freedom in arranging the parts of the internal conductors 6 which are exposed from the load board 3 so as to face the wafer 2. Therefore, the difficulty in designing the load board 3 so as to meet the required high-density arrangement of the contact members 4 can be significantly reduced. This embodiment offers similar advantages to the first embodiment.

Figure 4:
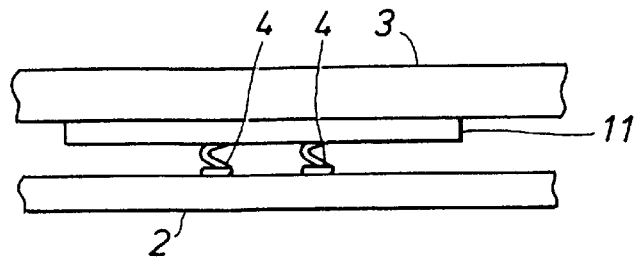
FIG. 4 is a view similar to FIG. 1 showing a third embodiment of the present invention using an insulating plate for defining a part of the support recess.
Figure 5:
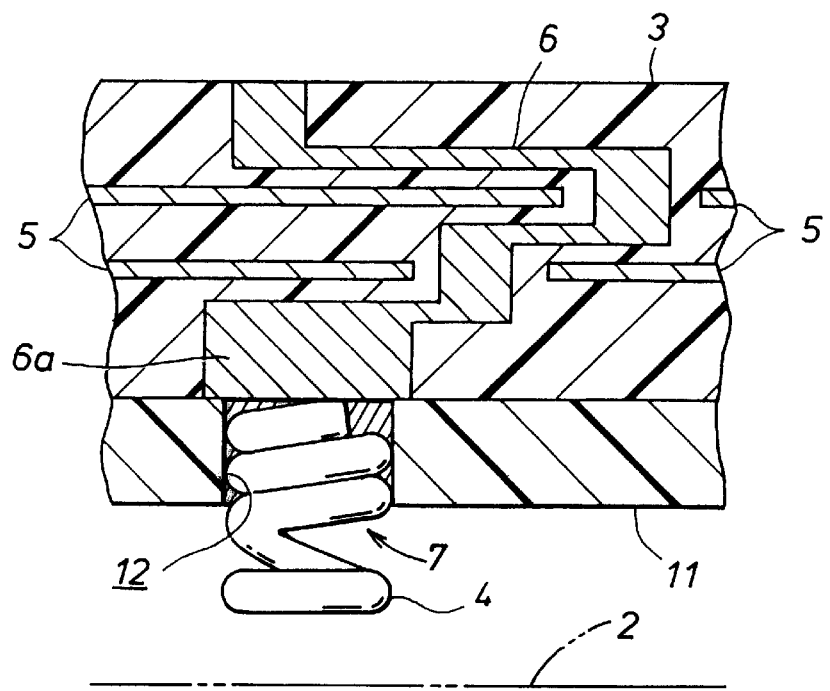
FIG. 5 is an enlarged sectional side view of an essential part of FIG. 4.

FIGS. 4 and 5 show a third embodiment of the present invention, and the parts in these drawings corresponding to those of the previous embodiments are denoted with like numerals. In this embodiment, the load board 3 is incorporated with an insulating plate 11 made of plastic material, for instance. The exposed parts 6a of the conductors 6 of the load board 3 are not provided with any recesses, but each support recess 7 is formed jointly by a through hole 12 passed through the insulating plate 11 and the unrecessed exposed part 6a of the internal conductors 6 defining the bottom end of the support recess 7.

The load board 3 and the insulating plate 11 are aligned with each other so that the exposed parts 6a of the internal conductors 6 define the bottom surfaces of the support recesses 7. Then, the closely wound end portion of each contact member 4 is received in the corresponding support recess 7 and is attached to the exposed part 6a of the internal conductor 6 by soldering or the like. This also integrally attaches the load board 3 and the insulating plate 11 together. If desired, the inner circumferential surface of each through hole 12 of the insulating plate 11 may be plated with electroconductive material so that the solder may also attach the closely wound end portion of the contact member 4 to the inner circumferential surface of the through hole 12 so that the overall state of attachment between the load board 3, the insulating plate 11 and the contact members 4 may be improved.

This embodiment allows the use of a simple load board merely by adding an insulating plate thereto, so that the existing resources may be efficiently utilized.

Figure 6:
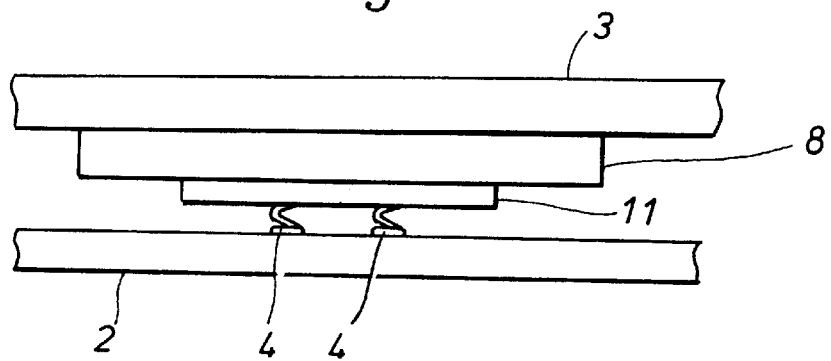
FIG. 6 is a view similar to FIG. 1 showing a fourth embodiment of the present invention using both an insulating plate and a relay board.

FIG. 6 shows a fourth embodiment of the present invention which combines a relay board 8 with the embodiment illustrated in FIGS. 4 and 5. Again, the parts corresponding to those of the previous embodiments are denoted with like numerals. In this case, a relay board 8 is placed over the load board 3 in a similar manner to the embodiment illustrated in FIG. 3, and an insulating plate 11 is in turn placed over the relay board 8. This embodiment provides similar advantages to the above described embodiments.

Figure 7:
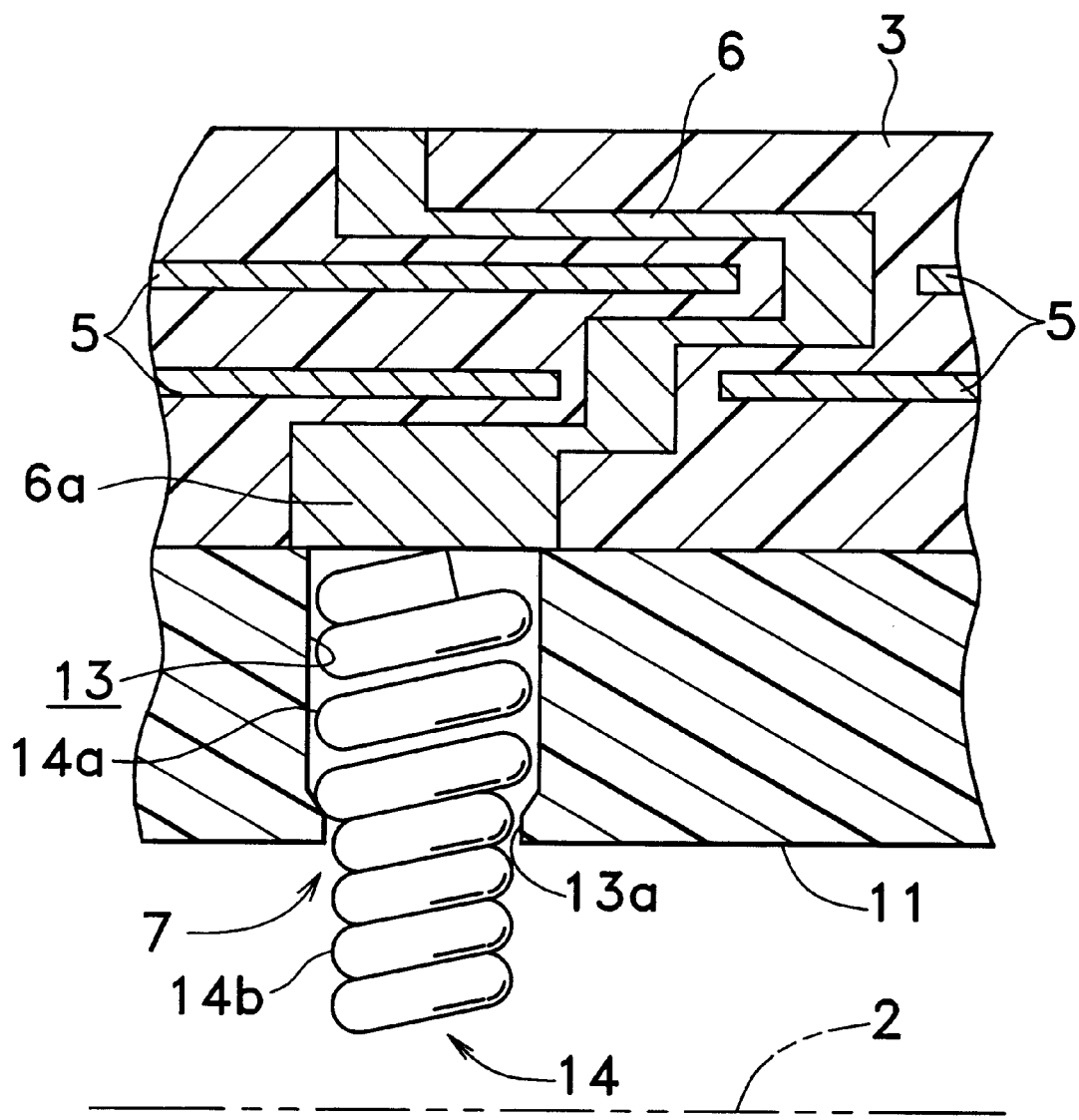
FIG. 7 is a view similar to FIG. 2 showing a fifth embodiment of the present invention.

FIG. 7 shows a fifth embodiment of the present invention, and the parts corresponding to those of the previous embodiments are denoted with like numerals.

In the fifth embodiment, the insulating plate 11 is placed over the surface of the load board 3 facing the wafer 2, and a plurality of through holes 13 are passed through the insulating plate 11. The insulating plate 11 is mounted to the load board 3 in such a manner that the exposed parts 6a of the internal conductors 6 are exposed inside the through holes 13 of the insulating plate 11.

Each through hole 13 receives a coarsely wound end portion 14a of a contact member 14 consisting of an electroconductive compression coil spring, and a closely wound portion 14b, which is given with a slightly smaller diameter and disposed coaxially to the coarsely wound end portion 14a, extends out of the through hole 13 of the insulating plate 11. The lower end of the through hole 13 is provided with a stepped portion 13a which allows the closely wound portion 14b to pass freely but prevents the coarsely wound portion 14a from coming out of the through hole 13. Thus, according to this embodiment, a support recess 7 opening toward the wafer 2 is jointly defined by the through hole 13 of the insulating plate 11 and the flat exposed portion 6a of the internal conductor 6.

The coarsely wound end portion 14a of the contact member 14 is in contact with the exposed part 6a of the associated internal conductor 6 exposed inside the support recess 7, and the shoulder defined between the coarsely wound portion 14a and the closely wound portion 14b is engaged by the stepped portion 13a so that the coarsely wound portion 14a is retained in a compressed state inside the support recess 7.

In this embodiment, because the coarsely wound portion 14a is axially compressed by a prescribed stroke, it is possible to ensure a certain stable contact pressure between the contact member 14 and the object to be tested as soon as the coil member or the contact member 14 is slightly compressed. Also, because the entire coarsely wound portion 14a is received inside the support recess 7, and only the closely wound portion 14b extends out of the support recess 7, it is possible to achieve a uniform projecting length for the contact members 14, hence a highly precise contact between the contact members 14 and the wafer 2 or other objects to be tested. Also, the replacement and servicing can be simplified because the assembly can be readily separated into separate components. During the assembly process, a contact member 14 is placed in each of the through holes 13 of the insulating plate 11, and the insulating plate 11 is subsequently placed over the load board 3 against the spring force of the coarsely wound portions 14a of the contact members 14, and secured thereto. Solder may be used for positively securing the base end of the contact member 14, but it is also possible to do away with it because the resiliency of the coarsely wound portion 14b may be sufficient to ensure a necessary contact between the base end of the contact member 14 and the internal conductor 6.

Figure 8:
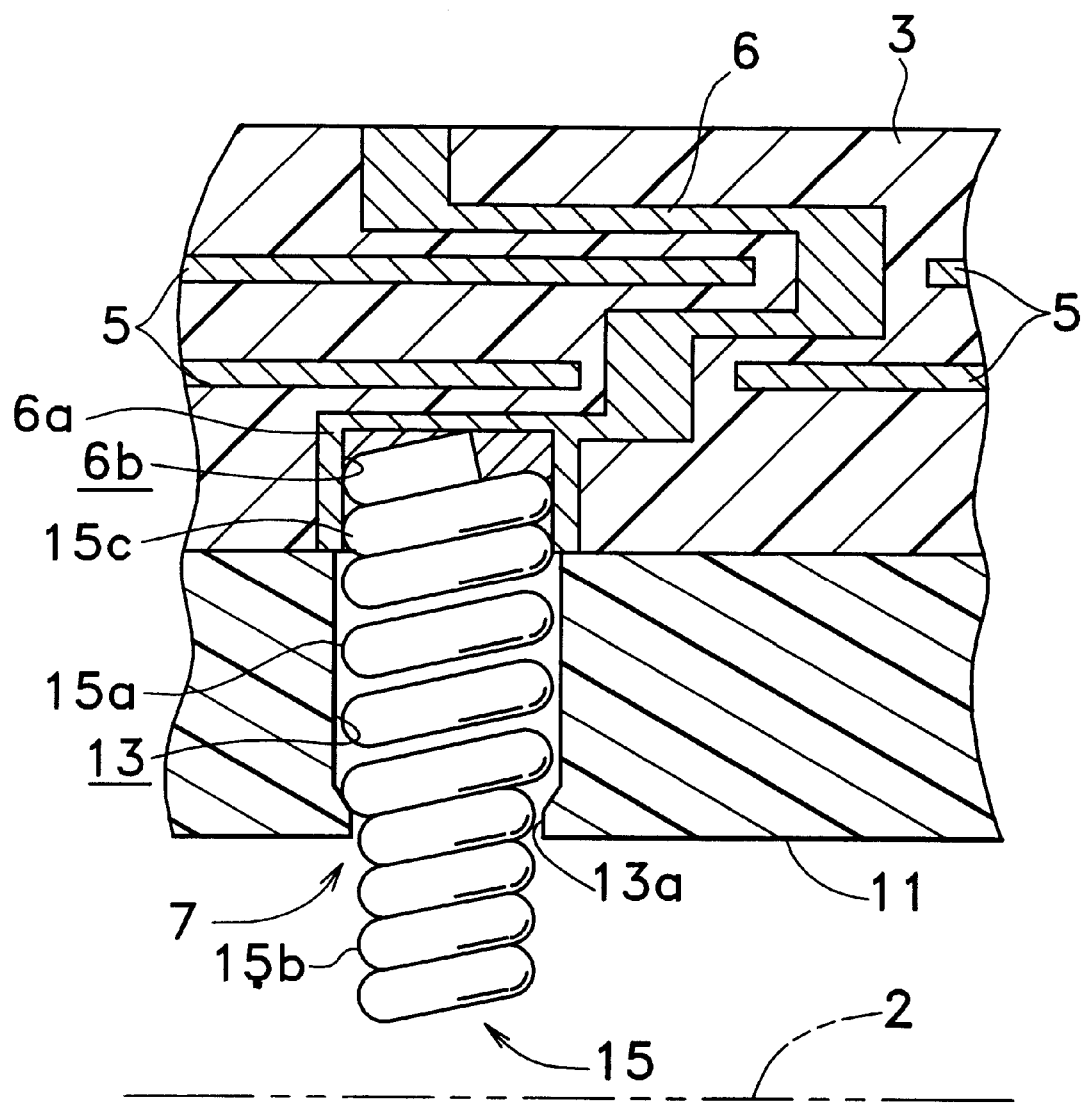
FIG. 8 is a view similar to FIG. 2 showing a sixth embodiment of the present invention.

FIG. 8 shows a sixth embodiment of the present invention, and the parts corresponding to those of the previous embodiments are denoted with like numerals. In the sixth embodiment which is particularly similar to the embodiment illustrated in FIG. 7, each contact member 15 includes, in addition to a closely wound portion 15a extending out of the support recess 7, and a coarsely wound portion 15b received inside the support recess 7, another closely wound portion 15c at the innermost end the contact member 15, adjacent to the coarsely wound portion 15b.

The exposed portion 6a of the internal conductor 6 of the load board 3 is provided with a recess 6b which is similar to the recess 6b of the first embodiment, and receives therein the closely wound portion 15c formed at the innermost end the contact member 15. The closely wound portion 15c is secured in the recess 6b by solder or the like so that the internal conductor 6 and the contact member 15 are connected with each other both electrically and mechanically.

According to this illustrated embodiment, because the contact member 15 is secured to the internal conductor 6 by solder, a reliable contact can be achieved, and the contact resistance can be minimized. Furthermore, because the coarsely wound portion 15a is retained inside the support recess 7 in an axially compressed manner, the closely wound portion 15b can be brought into contact with an object to be tested at a certain contact pressure as soon as the contact member 15 is brought into contact with an object to be tested. Also, because the coarsely wound portion 15a and the innermost closely wound portion 15c, which have a larger outer diameter than the outermost closely wound portion 15b, are retained inside the support recess 7 while the outermost closely wound portion 15b is allowed to project out of the support recess 7 with an annular shoulder defined between the parts having different outer diameters engaged by the stepped portion 13a of the through hole 13 of the insulating plate 11, the projecting length of the contact members 15 can be made uniform, and a high precision contact can be thereby achieved.

Figure 9:
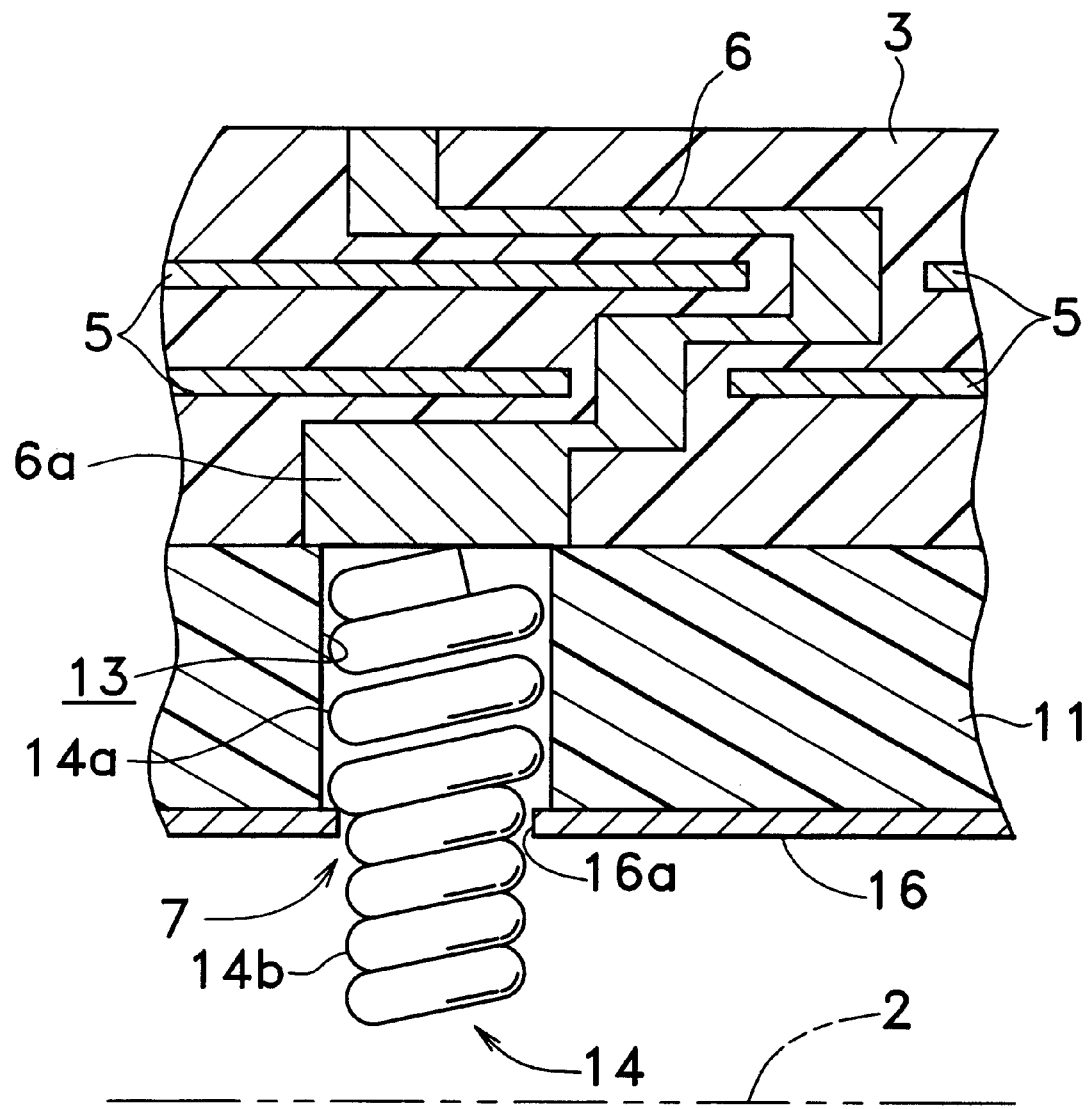
FIG. 9 is a view similar to FIG. 2 showing a seventh embodiment of the present invention.

FIG. 9 shows a seventh embodiment of the present invention, and the parts corresponding to those of the previous embodiments are denoted with like numerals. In this embodiment, a retaining plate 16 made of insulating material is placed over the outer surface of the insulating plate 11 (the side from which the contact members 14 project) to define a means for preventing the contact members 14 from coming out of the associated support recesses 7. The retaining plate 16 is provided with openings 16a which are so sized as to allow the closely wound portions 14b to freely pass therethrough but prevent the coarsely wound portions 14a from passing therethrough, instead of the stepped portions 13a provided in the outer ends of the through holes 13 in the previous embodiment illustrated in FIG. 7.

Each coarsely wound portion 14a is retained inside the support recess 7 by the retaining plate 16 in an axially compressed state similarly to the embodiment illustrated in FIG. 7 so that a certain contact pressure can be ensured, and a stable contact resistance can be achieved. Further, because the initial resilient loading is provided for each contact member by the compressed state of a part of the contact member, the projecting length of the contact members can be made uniform, and a precise contact state can be achieved with respect to the object to be tested.

Figure 10:
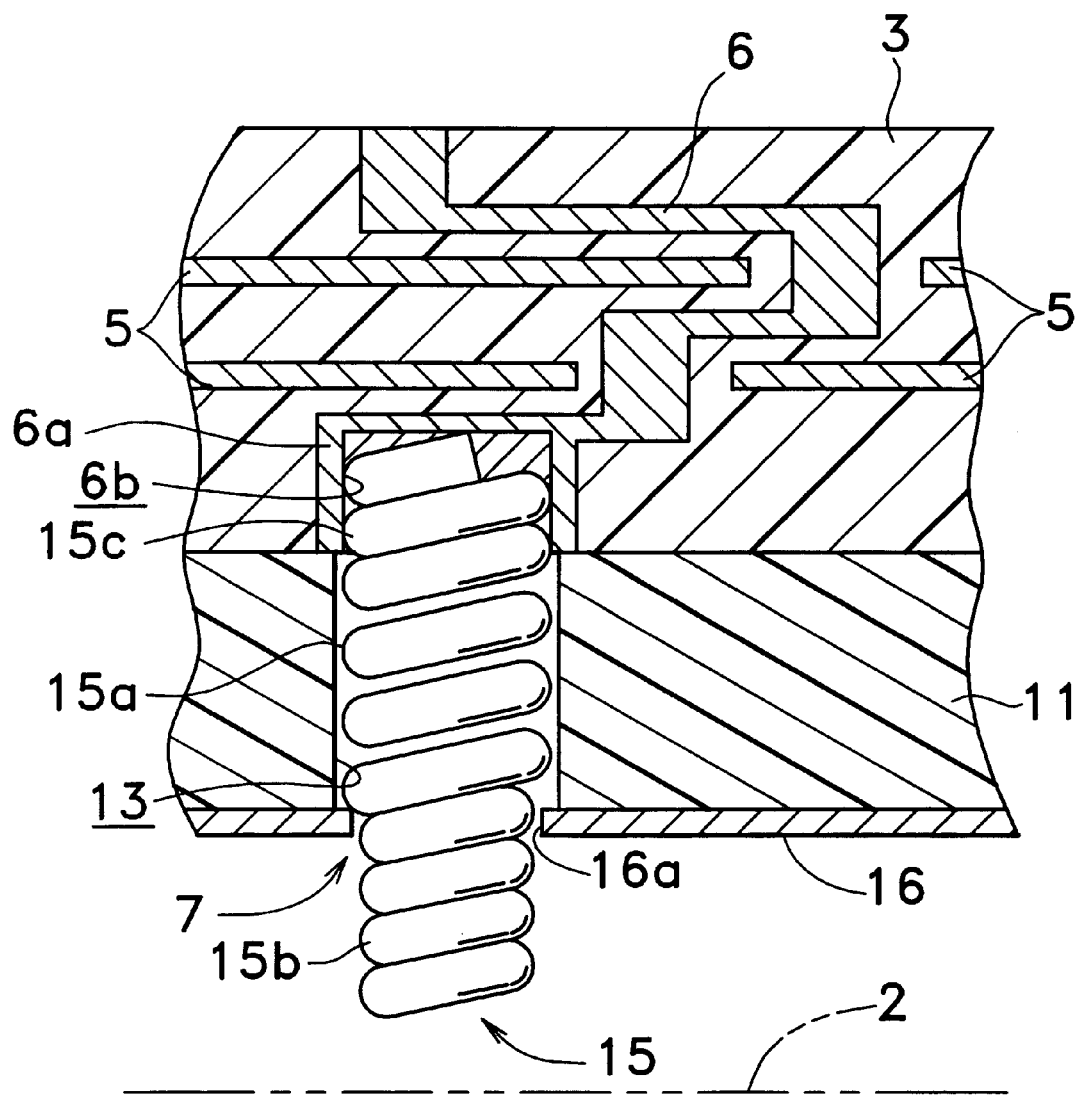
FIG. 10 is a view similar to FIG. 2 showing an eighth embodiment of the present invention.

FIG. 10 shows an eighth embodiment of the present invention, and the parts corresponding to those of the previous embodiment illustrated in FIG. 9 are denoted with like numerals. This embodiment is similar to the embodiment illustrated in FIG. 9 in that a retaining plate 16 is placed over the insulating plate 11, and is similar to the embodiment illustrated in FIG. 8 in that a closely wound portion 15c formed in continuation from the coarsely wound portion 15a at an inner end thereof is received in a recess 6b formed in the exposed portion 6a of the internal conductor 6, and secured therein by solder.

According to this embodiment, a stable and low-resistance engagement can be ensured between the internal conductor 6 and the contact member 15 similarly to the embodiment of FIG. 8. Additionally, because the coarsely wound portion 15a is retained inside the support recess 7 in an axially compressed state, and the closely wound portion 15b can be thereby brought into contact with an object to be tested with a certain contact pressure, a stable electric contact resistance can be achieved. Also, because the initial resilient loading is achieved by the compression of the part of the contact member 15 received inside the support recess 7, the projecting length of the contact members 15 can be made uniform, and a highly precise contact can be ensured.

Figure 11:
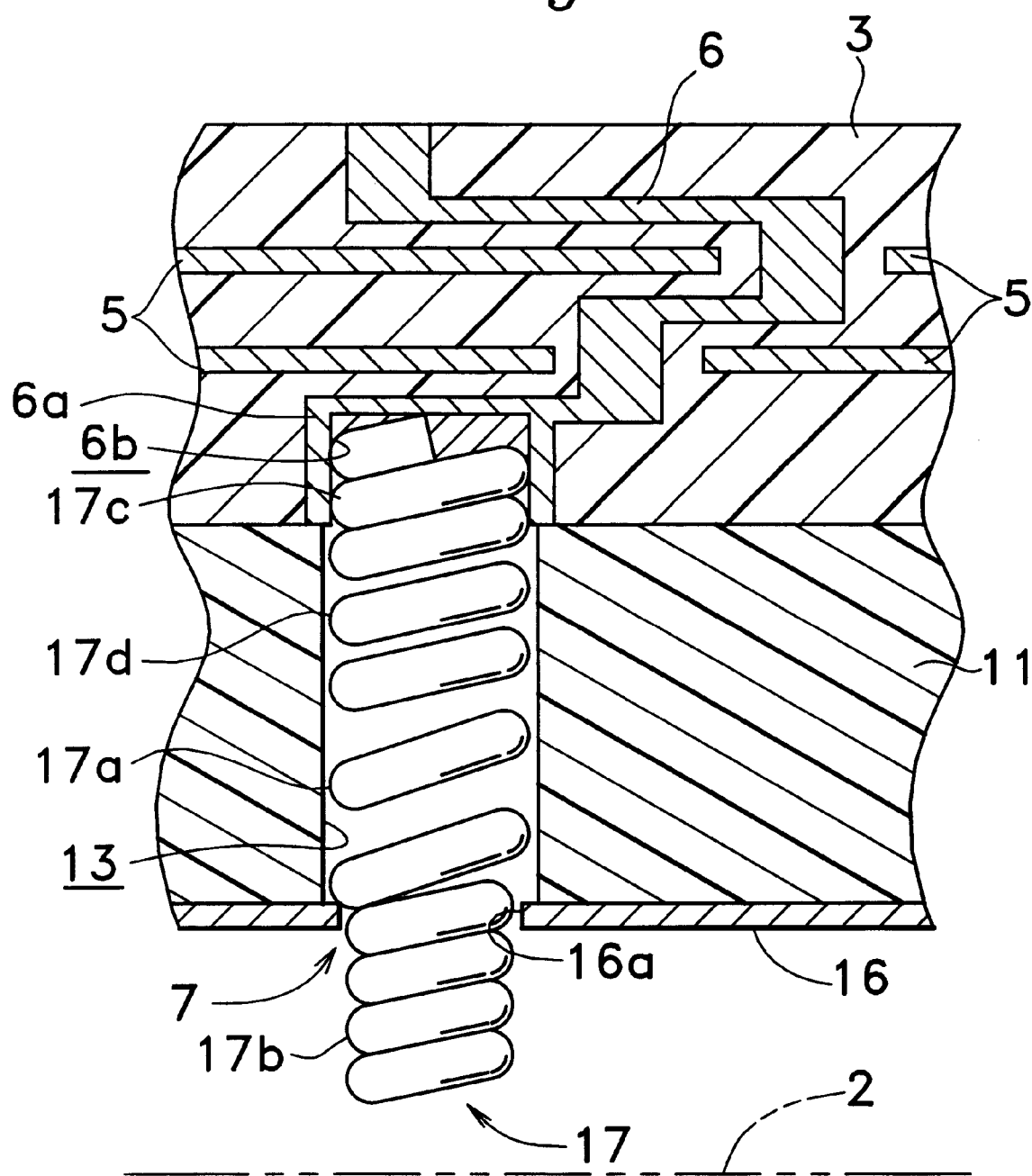
FIG. 11 is a view similar to FIG. 2 showing a ninth embodiment of the present invention.

FIG. 11 shows a ninth embodiment of the present invention, and the parts corresponding to those of the previous embodiment illustrated in FIG. 10 are denoted with like numerals. This embodiment is similar to the embodiment illustrated in FIG. 9 in that a retaining plate 16 is placed over the insulating plate 11, and a closely wound portion 17c is received in a recess 6b formed in the exposed portion 6a of the internal conductor 6, and secured therein by solder.

In this embodiment, the coarsely wound portion of the contact member 17 includes a large pitch portion 17a and a small pitch portion 17d having a smaller winding pitch than the large pitch portion 17a. According to this embodiment, when the contact member 17 is brought into contact with a wafer 2 or an object to be tested, the contact member 17 is axially compressed to such an extent that the adjacent wire sections of the small pitch portion 17d are brought into contact with each other so that the inductance and resistance of the contact member 17 during the testing process can be reduced.

FIG. 11 showed the arrangement which was modified from the embodiment of FIG. 10 so that the coarsely wound portion of the contact member has two different coil pitches, but the same principle is equally applicable to the embodiments illustrated in FIGS. 7 to 9. It is also applicable to the embodiments illustrated in FIGS. 1 to 6 which do not employ any insulating plate. In the latter case, the part of each contact member extending out of the assembly may have two different coil pitches.

The coil end of each of the contact members was not ground in the above described embodiments, but may also be ground in a plane perpendicular to the axial line of the coil. By so doing, the coil-shaped contact members may be able to stand upright when their base ends are each placed in the support recess with the flat axial end abutting the bottom surface of the support recess, and the assembly work for placing the contact members in the associated support recesses can be simplified. The flat end surface of the contact members also achieves a planar contact between the internal conductor and the contact member, and prevents any bending moment from being applied to the contact member. These two factors contribute to reducing the contact resistance between the internal conductor and the contact member.

The above described electroconductive contact units are useful not only for application in probe cards for testing semiconductor wafers, but also for application in sockets and connectors for semiconductor devices.

Figure 12:
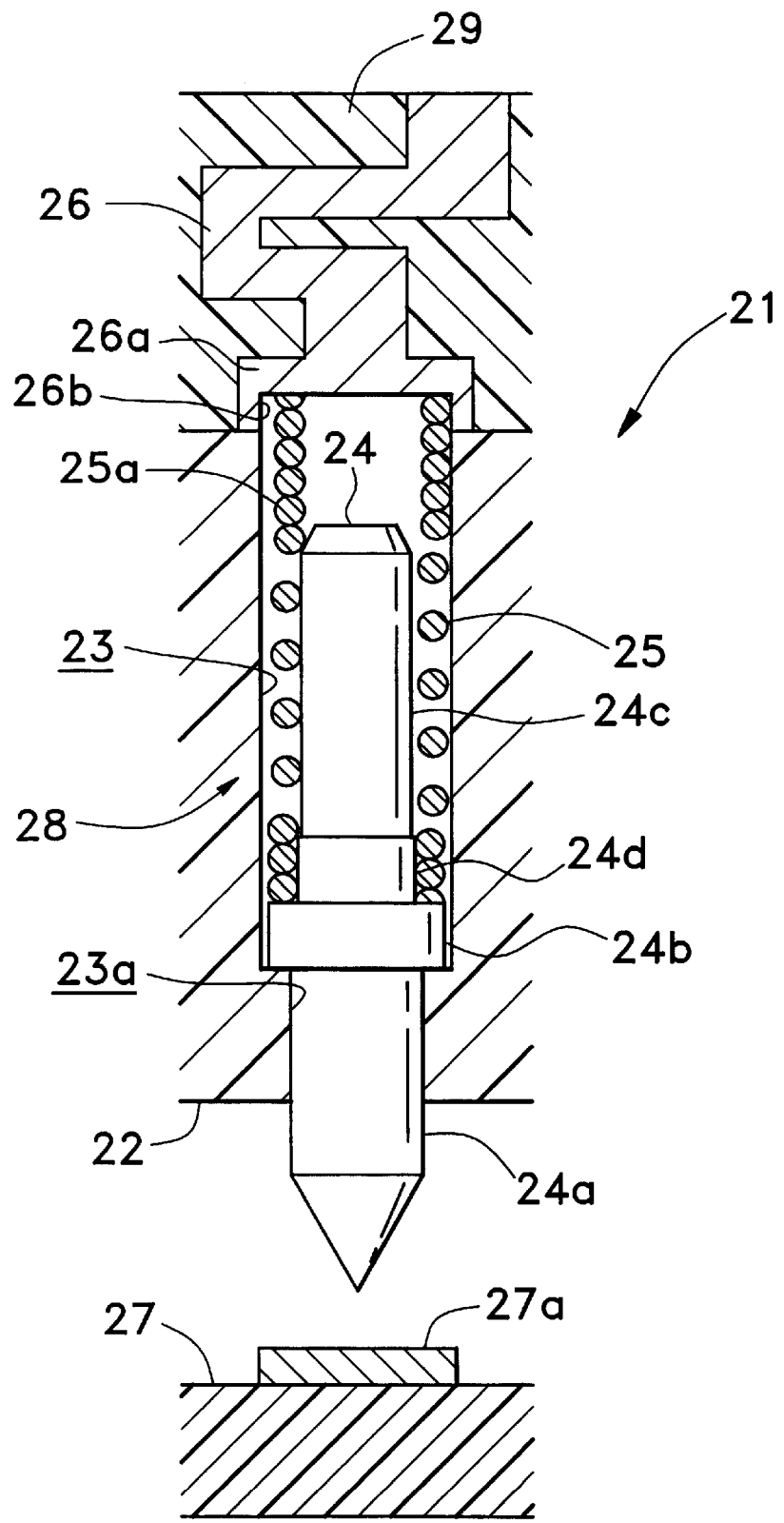
FIG. 12 is a longitudinal sectional view of a tenth embodiment of the present invention using a needle-shaped contact member and a separate compression coil spring for resiliently supporting the contact member.

FIG. 12 shows a sectional side view of a tenth embodiment of the present invention. This electroconductive contact unit 21 may be used individually, but more typically used in a large number in a parallel relationship for accessing a plurality of points of an object to be tested.

In this electroconductive contact unit 21, a support recess 28 is formed by a through hole 23 of an insulating plate 22 passed depthwise therethrough, and a needle-shaped electroconductive contact member 24 is coaxially received in this through hole 23. The contact member 24 is urged by a compression coil spring 25 outward. The upper surface of the insulating plate 22, as seen in the drawing, is securely attached to a relay board 29, one over the other, and an internal conductor 26 is integrally passed depthwise across the relay board 29. The relay board 29 may also consist of a load board.

A testing circuit board may be placed over the relay board 29, and the assembly may be adapted to different objects to be tested having different wiring patterns and terminal layouts by selecting suitably adapted relay boards.

The needle-shaped contact member 24 comprises a head 24a which is adapted to be brought into contact with an object to be tested such as a pad 27a on a printed circuit board 27, a large diameter portion 24b formed inwardly adjacent to the head 24a, and a stem portion 24c which extends from the large diameter portion 24b away from the head 24a, all in a coaxial relationship. The support recess 28 receives the large diameter portion 24b, and the compression coil spring 25 which is coaxially wound around the stem portion 24c. A small diameter portion 23a is formed at an end of the through hole 23 remote from the relay plate 29 and slidably receives the head 24a so that the contact member 24 is prevented from coming out of the support recess 28 by the large diameter portion 24b of the contact member 24 engaged by a shoulder defined between the small diameter portion 23a and the remaining part of the through hole 23. The forward end of the head 24a is formed as a pointed end in the illustrated embodiment, but the shape of the forward end of the head 24a can be selected as required according to the shape and material of each particular object to be tested. For instance, when a solder ball is to be accessed, the forward end of the head 24a may consist of a planar end surface instead of a pointed end.

As mentioned above, the compression coil spring 25 wound around the stem portion 24c is installed between the large diameter portion 24b and the relay board 29 in a pre-stressed condition. In the illustrated embodiment, a collar portion 24d having a slightly larger diameter than the inner diameter of the compression coil spring 25 is formed in the part of the stem portion 24c adjacent to the large diameter portion 24b so that the associated end of the compression coil spring 25 may resiliently fit onto the collar portion 24d. Therefore, the contact member 24 and the compression coil spring 25 can form an integral assembly before and during the time the contact member 24 is placed into the support recess 28, and the assembly process can be therefore simplified. The compression coil spring 25 may be attached to the collar portion 24d not only by a resilient engagement, but by solder, and may even be simply fitted onto the collar portion 24d without any significant resilient deformation of the compression coil spring 25.

The compression coil spring 25 includes a closely wound portion 25a at an inner axial end thereof, and the adjacent coil sections of the closely wound portion 25a are in mutual contact with each other under a free condition of the compression coil spring 25. The closely wound portion 25a extends over such a length that it slightly overlaps with the upper end of the stem portion 24c as seen in FIG. 12 under the rest condition illustrated in FIG. 12. One end of the compression coil spring 25 (the lower end as seen in FIG. 12) is secured to the part of the collar portion 24d of the contact member 24, and the other end (the upper end as seen in FIG. 12) of the closely wound portion 25a is received in the recess 26b formed in the part 26a of the internal conductor 26 exposed to the interior of the support recess 28, and abuts the bottom surface of the recess 26b.

The contact member 24 and the compression coil spring 25 may be plated with gold or otherwise surface processed, but may also consist of a simple material without any surface processing if the material is provided with suitable electric properties. So that the deflection of the compression coil spring 25 may be smoothly carried out, the inner diameter of the compression coil spring 25 is made slightly larger than the outer diameter of the stem portion 24c.

Figure 13:
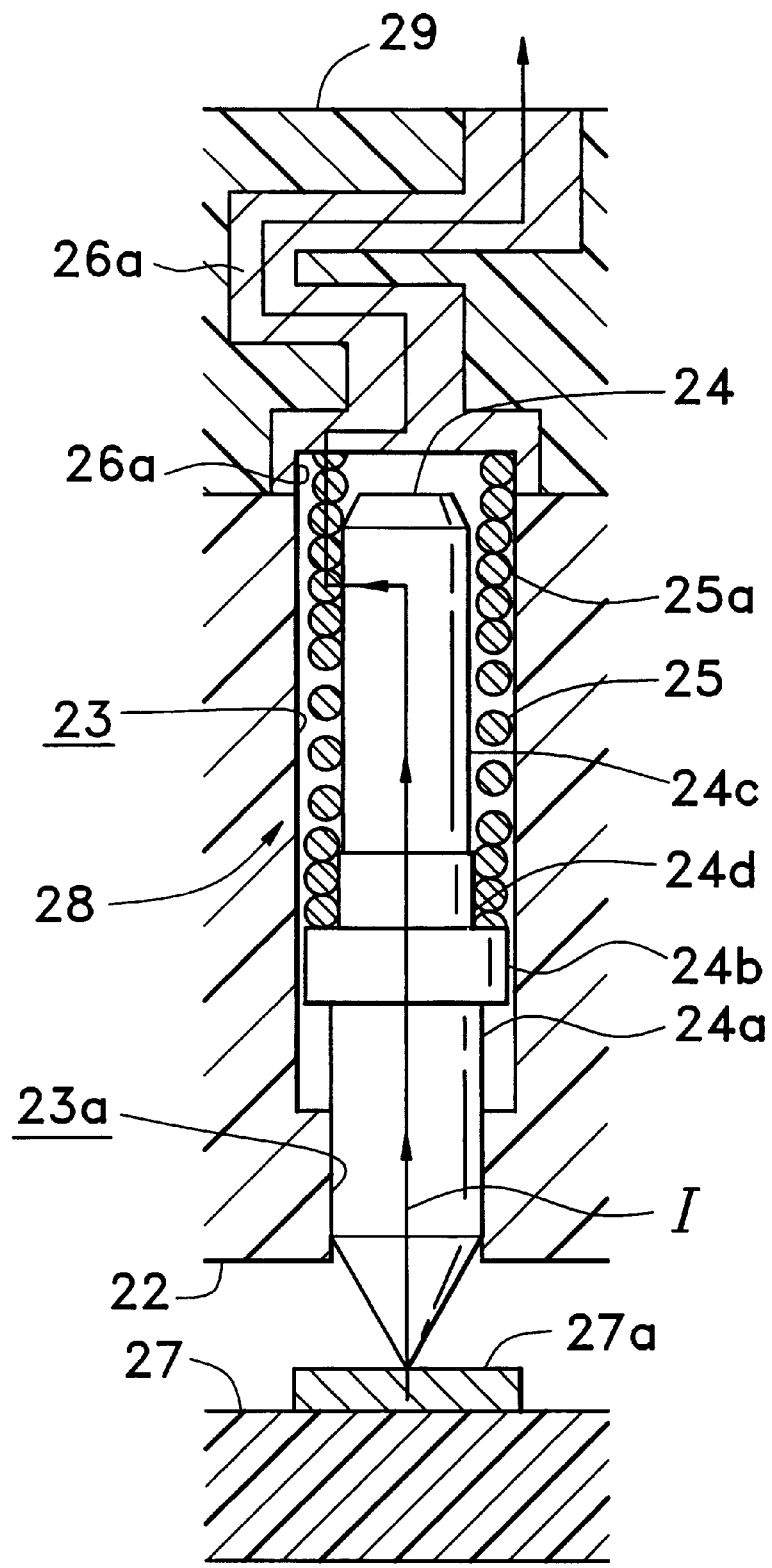
FIG. 13 is a view similar to FIG. 12 showing the operative state of the contact member of FIG. 12.

When carrying out a test by using this electroconductive contact unit 21, the assembly is moved toward the object 27 to be tested until the forward end of the head 24a comes into contact with the pad 27a and the compression coil spring 25 is compressed as illustrated in FIG. 13. The contact member 24 is thereby pushed against the pad 27a with a pressure sufficient to break through an oxide film which may be formed on the surface of the pad 27a.

The electric signal for the test is transmitted from the pad 27a to the internal conductor 26a via the contact member 24 and the compression coil spring 25 as indicated by arrow I in FIG. 13. Because the inner diameter of the compression coil spring 25 is slightly larger than the outer diameter of the stem portion 24c of the contact member 24, the compressive deflection of the coil spring 25 causes the coil spring 25a to be bent or to curve to such an extent that a part of the inner surface of the closely wound portion 25 at the base end of the coil spring 25 touches the outer surface of the stem portion 24c.

As a result, the electric signal is transmitted from the contact member 24 to the coil spring 25 via the contact area which has developed between the closely wound portion 25a and the stem portion 24c, and the electric signal can be therefore conducted in an axially straight direction along the compression coil spring 25 so that the inductance and the resistance may be substantially reduced as compared to the case where the electric signal is transmitted along a spiral path defined by the coil wire of the coarsely wound portion of the compression coil spring 25.

The rear end of the stem portion 24c barely overlaps with the closely wound portion 25a of the compression coil spring 25 in the rest condition illustrated in FIG. 12, but may also more significantly overlap the closely wound portion 25a. It is also possible to eliminate any such overlap in the rest condition of the assembly. It suffices if the stem portion 24c contacts the closely wound portion 25a as soon as the contact member 24 is brought into contact with the pad 27a, and pushed into the assembly despite some irregularities in the vertical positions of the parts to be accessed and the resulting unevenness in the amount of deflection of the compression coil spring from one assembly to another.

Figure 14:
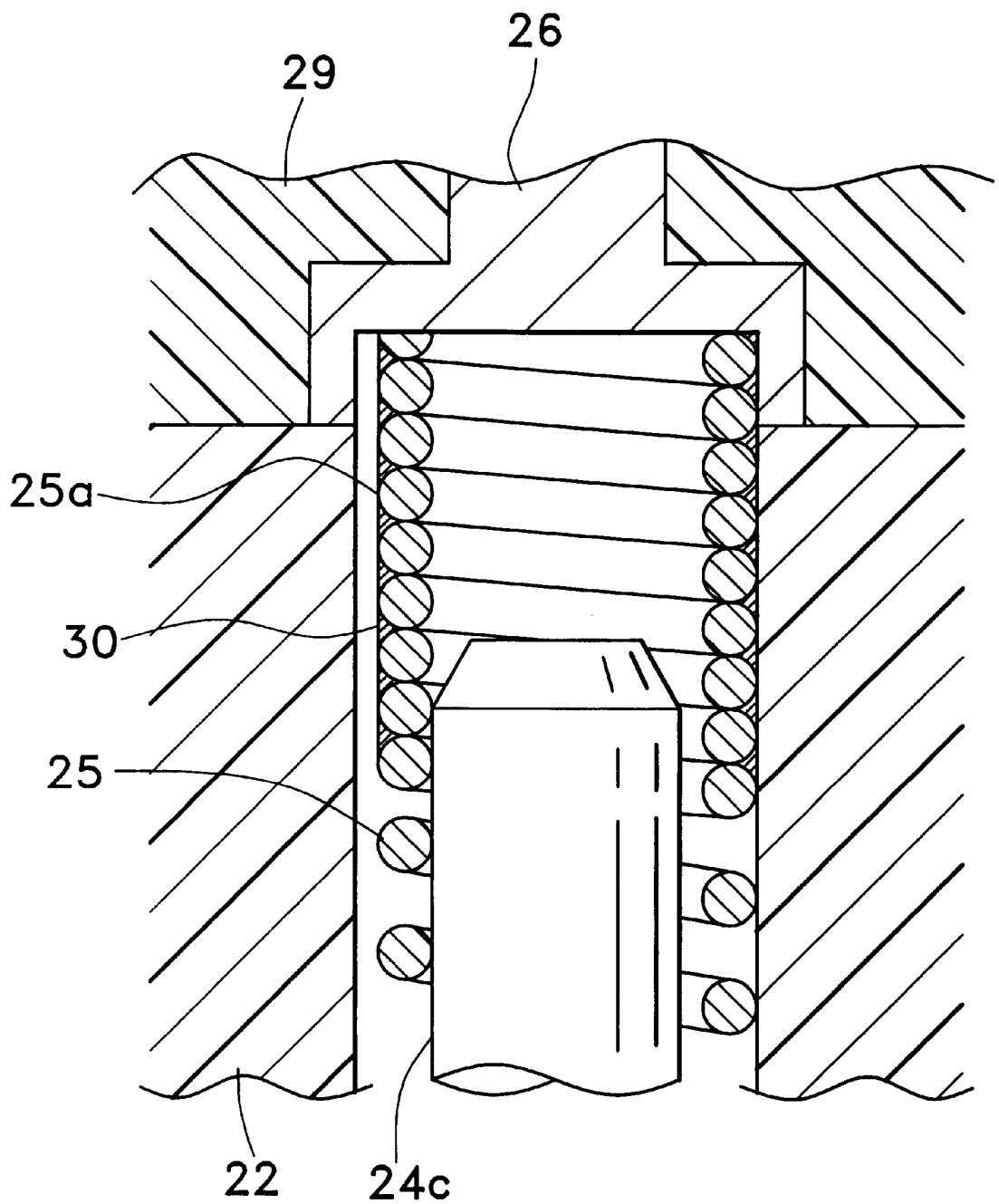
FIG. 14 is a fragmentary sectional view showing an eleventh embodiment of the present invention.

It is also possible to form an electroconductive film 30 integrally over the outer circumferential surface of the closely wound portion 25a of the compression coil spring as illustrated in FIG. 14. This in effect turns the closely wound portion 25a into a solid tube, and the electric property of the assembly can be improved even further. However, according to the broadest concept of the present invention, the closely wound portion 25a is preferable but purely optional, and can be eliminated without any significant reduction in performance depending on the application.

Figure 15:
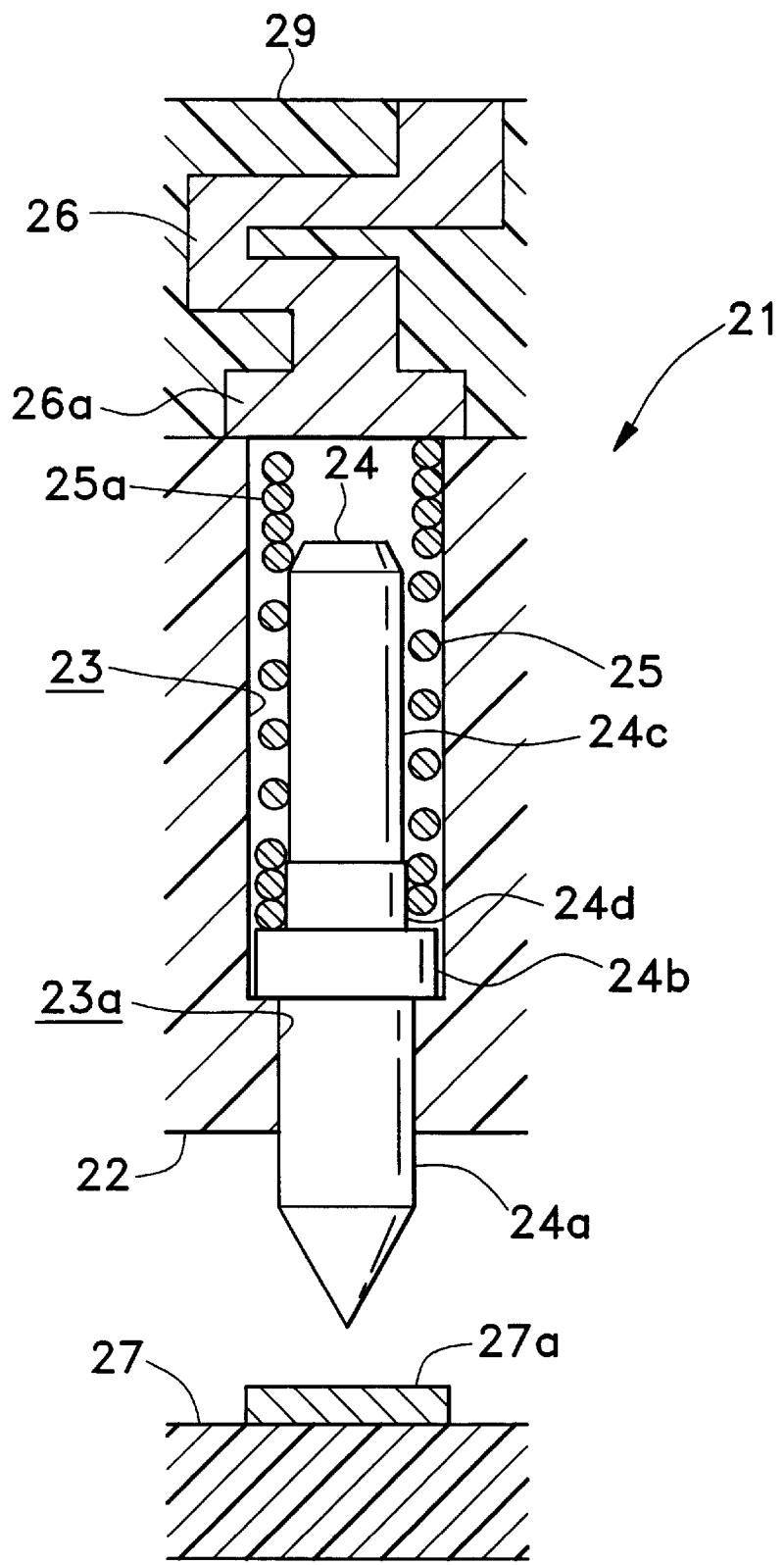
FIG. 15 is a view similar to FIG. 12 showing a twelfth embodiment of the present invention.
Figure 16:
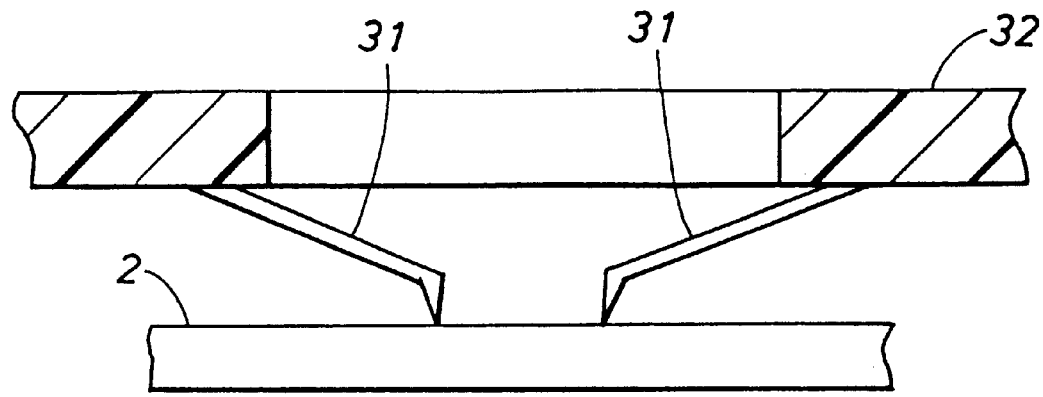
FIGS. 16 and 17 are simplified side views showing conventional contact probe units.
Figure 17:
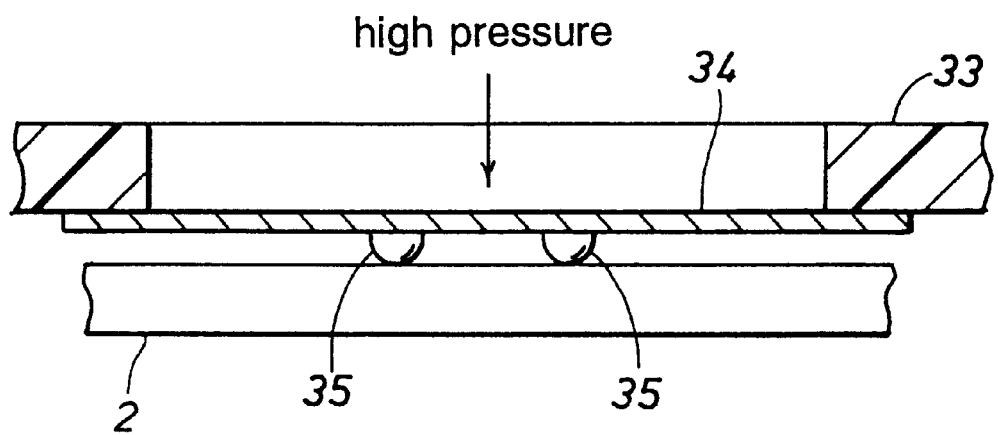

In the previous embodiment, the end of the internal conductor 26a exposed to the interior of the support recess 28 was provided with a recess 26b to receive the base end of the compression coil spring 25, but may also be completely flush with the interface between the insulating plate 22 and the relay board 26 as illustrated in FIG. 15 in which the parts corresponding to the previous embodiment are denoted with like numerals.

With respect to all of the embodiments illustrated in FIGS. 12 to 15, the internal conductor 26 may be attached to the base end of the compression coil spring 25 by solder so that the electric property may be further improved. The coil ends of the compression coil springs of the illustrated embodiments were ground into a plane perpendicular to the axial line of the coil, but may not be ground particularly when the coil diameter is relatively small.

What is claimed is:

1. An electroconductive contact unit, comprising:
   a base board having a surface and an internal conductor;
   a support recess formed on said surface and exposing an end of said internal conductor to an interior of said recess; and
   an electroconductive coil spring received in said support recess and having an inner end which is in electric contact with said exposed end of said internal conductor, and having an outer end which axially moveably projects out of said support recess, and is adapted to contact an object to be accessed.

2. An electroconductive contact unit according to claim 1, wherein said base board is incorporated with an internal circuit.

3. An electroconductive contact unit according to claim 1, wherein said inner end of said electroconductive coil spring comprises a closely wound portion.

4. An electroconductive contact unit according to claim 1, wherein said inner end of said coil spring is soldered to an electroconductive part of said support recess which is electrically connected to said internal conductor.

5. An electroconductive contact unit according to claim 1, wherein said coil spring comprises a coarsely wound portion which is retained inside said support recess in a pre-compressed state.

6. An electroconductive contact unit according to claim 5, wherein said coarsely wound portion of said coil spring includes a large pitch portion and a small pitch portion.

7. An electroconductive contact unit according to claim 5, wherein said coil spring comprises a closely wound portion which extends out of said support recess.

8. An electroconductive contact unit according to claim 1 further comprising a needle-shaped member slidably received in said support recess, wherein said coil spring is interposed between a bottom end of said support recess and an annular shoulder defined in said contact member.

9. An electroconductive contact unit according to claim 8, wherein said coil spring comprises a base end consisting of a closed wound portion thereof which is adapted to establish an electric connection with a base end of the needle-shaped member at least when said coil spring is compressed as a result of a contact between a forward end of said needle-shaped member and an object to be tested.

10. An electroconductive contact unit according to claim 9, wherein adjacent coil sections of said closely wound portion of said coil spring are joined by solder or brazing material.

11. An electroconductive contact unit according to claim 8, wherein said needle-shaped member comprises a collar portion adjacent to said shoulder which is adapted to resiliently fit into a forward end of said coil spring.

12. An electroconductive contact unit according to claim 1, wherein said support recess is formed by a recess formed in said exposed end of said internal conductor.

13. An electroconductive contact unit according to claim 1, further comprising an insulating plate which is placed over said surface of said base board, said support recess being defined jointly by said exposed end of said internal conductor, and an inner circumferential surface of a through hole passed through said insulating plate in axial alignment with said exposed end of said internal conductor.

14. An electroconductive contact unit according to claim 13, wherein said through hole of said insulating plate is provided with a small diameter portion at an end remote from said base board, said small diameter portion providing retaining means for restricting a projecting length of said needle-shaped member out of said support recess.

15. An electroconductive contact unit according to claim 13, further comprising a retaining plate placed over a surface of said insulating plate remote from said base board, said retaining plate being provided with a through hole which is aligned with said through hole of said insulating plate and has a smaller diameter than said through hole of said insulating plate so as to provide retaining means for restricting a projecting length of said needle-shaped member out of said support recess.

16. An electroconductive contact unit, comprising:

a base board having a surface and an internal conductor having an end exposed at said surface;

an insulating plate which is placed over said surface of said base board;

a support hole formed in said insulating plate so as to expose said exposed end of said insulator to an interior of said hole; and a contact assembly received in said support hole and having an inner end which is in electric contact with said exposed end of said internal conductor, and having an outer end which axially movably projects out of said support hole, and is adapted to contact an object to be accessed, said contact assembly comprising a needle-shaped member slidably received in said support hole, and an electroconductive compression coil spring interposed between said exposed end of said internal conductor and an annular shoulder defined in said needle-shaped member.

17. An electroconductive contact unit according to claim 16, wherein said support hole is provided with a small diameter portion at an end remote from said base board, said small diameter portion providing retaining means for restricting a projecting length of said contact assembly out of said support hole.

18. An electroconductive contact unit according to claim 16 further comprising a retaining plate placed over a surface of said insulating plate remote from said base board, said retaining plate being provided with a through hole which is aligned with said support hole and having a smaller diameter than said support hole so as to provide retaining means for restricting a projecting length of said contact assembly out of said support hole.

* * * * *